United States Patent
Yang et al.

(10) Patent No.: US 7,795,901 B1
(45) Date of Patent: Sep. 14, 2010

(54) AUTOMATIC ISOLATION OF A DEFECT IN A PROGRAMMABLE LOGIC DEVICE

(75) Inventors: Bobby Yang, Los Altos Hills, CA (US); Reto Stamm, Sunnyvale, CA (US); Stephen M. Trimberger, San Jose, CA (US); Christopher H. Kingsley, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/468,638

(22) Filed: May 19, 2009

(51) Int. Cl.
*G01R 31/28* (2006.01)
*H03K 19/00* (2006.01)

(52) U.S. Cl. .................. 326/16; 326/9; 716/17
(58) Field of Classification Search .............. 326/9, 326/16, 40, 41, 47; 714/30, 726; 716/16, 716/17
See application file for complete search history.

(56) References Cited

U.S. PATENT DOCUMENTS 7,234,120 B1 * 6/2007 Staab et al. ............... 716/4
7,251,804 B1 * 7/2007 Trimberger .............. 716/16

OTHER PUBLICATIONS

Goldstein, Seth Copen et al., "PipeRench: A Reconfigurable Architecture and Compiler," *Computer*, Apr. 2000, pp. 70-77, vol. 33, Issue 4.

* cited by examiner

*Primary Examiner*—Daniel D Chang
(74) *Attorney, Agent, or Firm*—LeRoy D. Maunu

(57) ABSTRACT

A defect is automatically isolated in an integrated circuit device having programmable logic and interconnect circuits. A sequence of configurations is created to route data in a pattern through the programmable logic and interconnect circuits. Each configuration within the sequence is determined (e.g., generated or selected from a plurality of pre-generated configurations) as a function of output data from a prior configuration in the sequence. For each configuration in the sequence, the programmable logic and interconnect circuits are configured with the configuration and an automatic test instrument routes data in the pattern through the programmable logic and interconnect circuits. For each configuration in the sequence, the output data from the programmable logic and interconnect circuits is assessed. For each configuration in the sequence, the assessed output data isolates the defect to a portion of the pattern for the configuration that is within the portion for a prior configuration in the sequence.

20 Claims, 5 Drawing Sheets

(12) United States Patent

AUTOMATIC ISOLATION OF A DEFECT IN A PROGRAMMABLE LOGIC DEVICE

FIELD OF THE INVENTION

The present invention generally relates to testing programmable logic devices, and more particularly to fault isolation for defective programmable logic devices.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

There are instances in which a PLD may be manufactured with a defect that affects the intended operation of the PLD. When a defective PLD is encountered, the defective PLD may need to be analyzed to determine if there are recurring types of defects that need to be addressed by either modifying the design of the PLD or correcting a manufacturing process. The analysis of a defective PLD may be time consuming and expensive.

SUMMARY OF THE INVENTION

Various embodiments of the invention provide a method for automatically isolating a defect in a programmable logic device (PLD). A sequence of configurations is created to route data in a pattern through the programmable logic and interconnect circuits of the PLD. Each configuration within the sequence is determined (e.g., generated or selected from a plurality of pre-generated configurations) as a function of output data from a prior configuration in the sequence. For each configuration in the sequence, the programmable logic and interconnect circuits are configured with the configuration and an automatic test instrument routes data in the pattern through the programmable logic and interconnect circuits. For each configuration in the sequence, the output data from the programmable logic and interconnect circuits is assessed. For each configuration in the sequence, the assessed output data isolates the defect to a portion of the pattern for the configuration that is within the portion for a prior configuration in the sequence.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

A comprehensive, automatic solution is provided for the isolation of bridging faults and other defects in an integrated circuit device. In the examples that follow, integrated circuits that have programmable logic using snake chain patterns are referred to for clarity and exemplary purposes. A snake chain pattern may form a long shift register primarily for testing the programmable interconnect circuits of the integrated circuit. It is noted that, while the following description of embodiments of the present invention refers to programmable logic devices (PLDs) such as field-programmable gate arrays (FPGAs), embodiments may be implemented in other types of integrated circuit devices.

A series of automatic tests may selectively alter the input/output blocks (IOBs) along the snake chain pattern to isolate the defect to a portion of the snake chain pattern between two of the IOBs. Another series of automatic tests may truncate the snake chain pattern, by selectively removing flip-flops on the snake chain pattern between the two IOBs, to isolate the defect between two of the flip-flops. Further automatic tests may determine whether the defect is one end of a bridging fault. If the defect is a bridging fault, additional automatic tests may determine the other end of the bridging fault.

Each automatic test may generate configuration data that is loaded into the programmable logic and interconnect circuits of the PLD. The configuration data may configure the programmable logic and interconnect circuits to implement a modification of the original snake chain pattern. Data may be shifted through the snake chain pattern and the output data may be checked for a defect detected by the test. A subsequent test may be automatically generated as a function of the output data from one or more prior tests. Thus, each automatic test may be sequentially generated from one or more prior automatic tests.

It is noted here that, in an alternative embodiment, configuration data may be generated by pre-computation (pre-generated) for later use during testing. This saved data can be accessed rather than being generated anew for subsequent testing, saving the time otherwise attributable to configuration generation. In an integrated circuit requiring a large number of test configurations, the time not spent generating the configurations can be significant. In such a case, the stored configuration data can be selected based on output data from prior testing.

Figure 1:
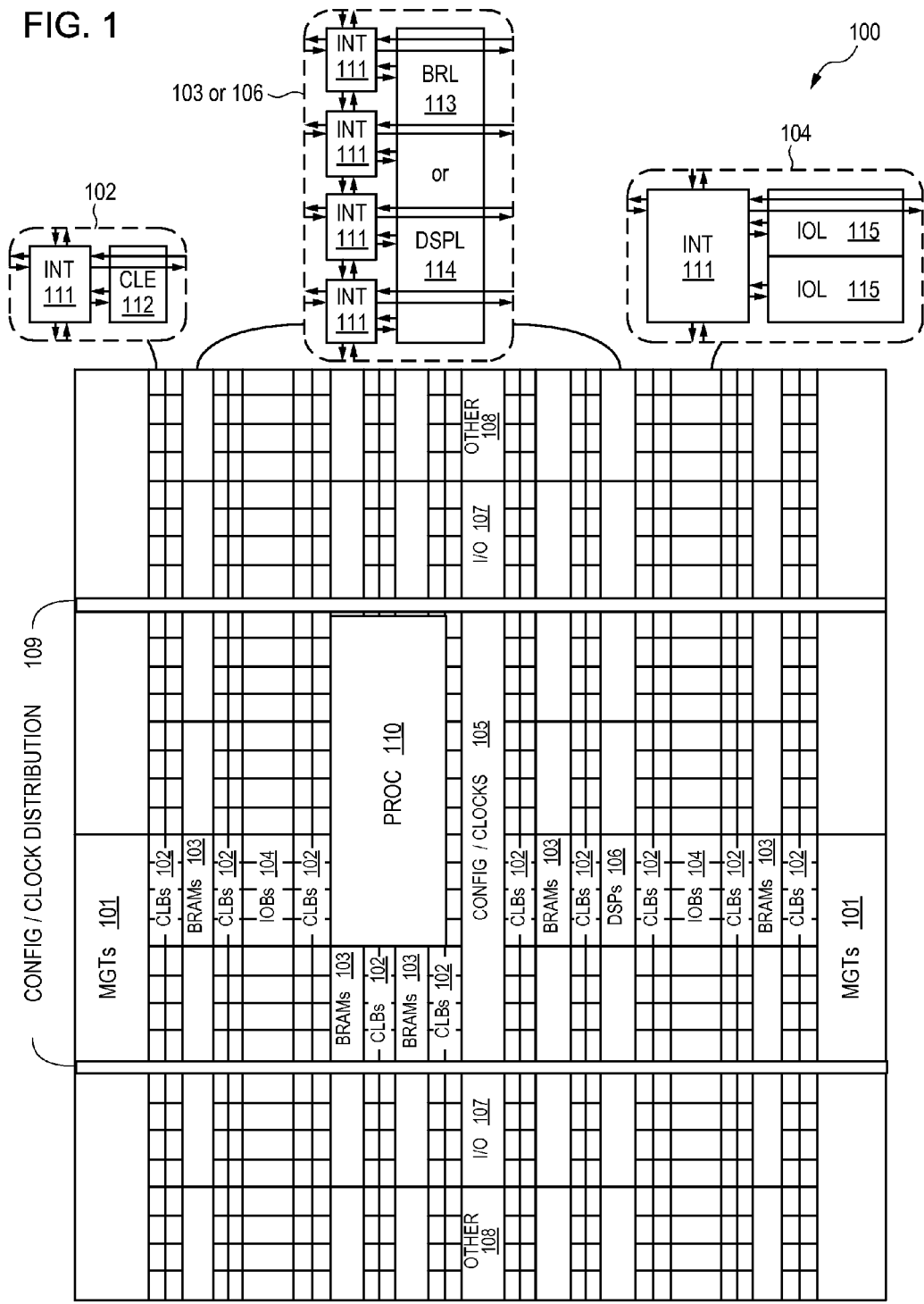
FIG. 1 is a block diagram of a programmable logic device analyzed in accordance with various embodiments of the invention.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
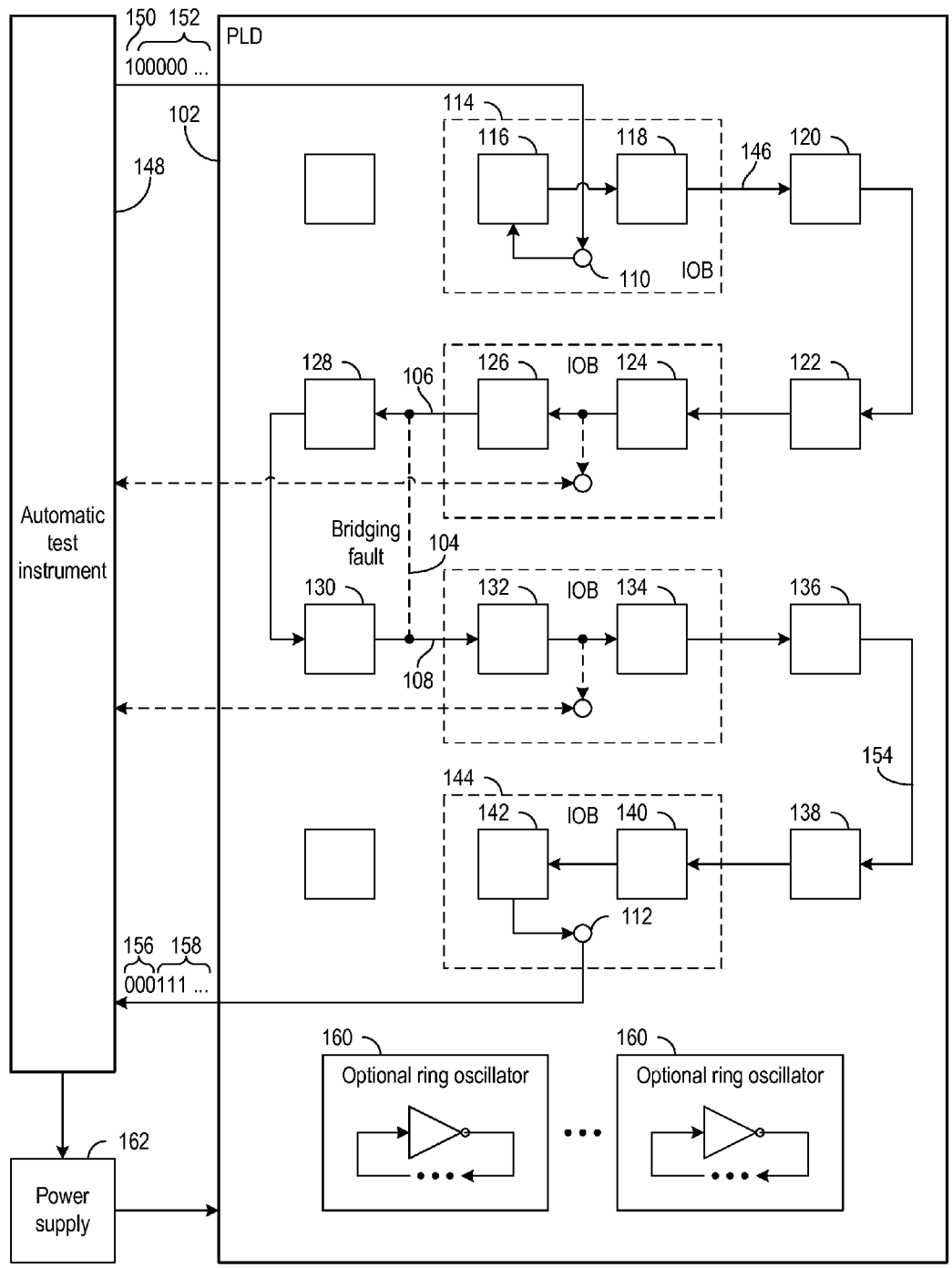
FIG. 2 is a block diagram of an automatic test arrangement for isolating a defect in a programmable logic device in accordance with various embodiments of the invention.

FIG. 2 is a block diagram of an automatic test arrangement for isolating a defect in a programmable logic device (PLD) 102 in accordance with various embodiments of the invention. An example defect in PLD 102 is bridging fault 104 that shorts between the programmable interconnect circuits on lines 106 and 108, respectively.

Snake chain patterns may primarily test the programmable interconnect circuits of a PLD. Snake chain patterns may have a limited number of inputs and outputs that make snake chain patterns amenable for Automatic Test Environment (ATE) testing and permit quick analysis of certain defects, such as static stuck-at faults. For example, the snake chain pattern may have a single input at pin 110 of PLD 102 and a single output at pin 112 of PLD 102.

The snake chain pattern may be a long shift register that utilizes as much of the programmable interconnect circuits as possible. The long shift register may start at pin 110 of IOB 114 connected to input flip-flop 116, and continue via flip-flops 118 through 140 to output flip-flop 142 connected to pin 112 of IOB 144. PLD 102 may include programmable interconnect circuits that permit flip-flop 118 to be connected to various destinations, and the snake chain pattern may be specified to connect flip-flop 118 to flip-flop 120 via the programmable interconnect circuit on line 146.

Flip-flops 116 through 142 may share a common clock and a common reset that initializes all of these flip-flops to the same value. After initialization of flip-flops 116 through 142 on the snake chain pattern, the automatic test instrument 148 may first supply a token bit value 150 to pin 110 of PLD 102. The token bit value 150 may have the opposite value of the initialization value of the flip-flops 116 through 142. The token bit value 150 may be loaded into flip-flop 116 during a first cycle of the clock, while the preceding value of flip-flop 116 may be shifted into flip-flop 118. Similarly, the values of flip-flops 118 through 140 may shift to a next flip-flop on the snake chain pattern. After the token bit value 150, the automatic test instrument 148 may supply a series 152 of the initialization value to pin 110 of PLD 102 in subsequent clock cycles. It will be appreciated that an automatic test from the automatic test instrument 148 may have a token bit value of either one or zero.

The expected output data at pin 112 of PLD 102 is an initialization value for each flip-flop 116 through 142 followed by the token bit value 150 and the series 152 of the initialization value. Thus, when the number of flip-flops 116 through 142 on the snake chain pattern is X, then every value observed at pin 112 should match the initialization value except for the value in clock cycle X+1.

If the PLD has a stuck-at fault matching the token bit value 150 at the programmable interconnect circuit on line 154, the output data at pin 112 of PLD 102 may instead be a three bit long series 156 of the initialization value from flip-flops 142, 140, and 138, followed by a continuous stream 158 of the value of the stuck-at fault. Such output data may have the "signature" of a stuck-at fault. The number of clock cycles before the first appearance of the stuck-at fault value may determine a position between flip-flops 136 and 138 for the stuck-at fault.

A bridging fault may be an unwanted short circuit between two wires in PLD 102. The behavior may be complex when using a snake chain pattern to test a PLD 102 with such a fault. For example, a bridging fault on line 104 with a high resistance may marginally affect the high speed dynamic behavior of the shorted wires of the programmable interconnect circuits on lines 106 and 108. However, a bridging fault on line 104 with a low resistance may be apparent even for low frequency operation of PLD 102.

The bridging fault 104 may short a wire with a strong driver to a wire with a weak driver. When the snake chain pattern includes both the strong and weak drivers, the strong driver may be positioned along the snake chain pattern before or after the weak driver. If the strong driver is after the weak driver on a snake chain pattern, when the weak driver outputs the token bit value the strong driver may overdrive the token bit value with the initialization value, and output data may match the signature of a stuck-at fault. It will be appreciated that this defect may have output data for another snake chain pattern that does not match the signature of a stuck-at fault. If the strong driver is before the weak driver on a snake chain pattern, the token bit value may appear to "jump" ahead along the snake chain pattern. For shorted wires having wired-or drivers, the output data for a snake chain pattern may include a repeating sequence of bit values. A bridging fault 104 may be indicated by output data that does not match either the expected data or a stuck-at fault signature.

In addition to routing data from automatic test instrument 148 in a snake chain pattern, an automatic test of PLD 102 may optionally include ring oscillators 160 that route oscillating data through a loop pattern in the programmable logic and interconnect circuits of PLD 102. The ring oscillator 160 may generate heat and/or noise that affect the output data at pin 112 for a snake chain pattern. For example, the output data may match the expected data when the number of ring oscillators 160 is below a threshold and the expected data may have a stuck-at fault signature when the number of ring oscillators 160 is above the threshold. A sequence of automatic tests may vary the number of ring oscillators 160 to determine this threshold using, for example, a binary search.

The configuration of PLD 102 for an automatic test may include a configuration of power supply 162 in addition to the configuration data for configuring the programmable logic and interconnect circuits of PLD 102. Thus, the configuration for PLD 102 may include setting one or more power supply voltages of PLD 102. For a particular defect and snake chain pattern, the output data at pin 112 might not match the expected data including the input data of value 150 and series 152 only when a power supply voltage is, for example, below a threshold voltage within the allowed range for the power supply voltage. A sequence of automatic tests may configure the PLD 102 with various power supply voltages to determine this threshold voltage using, for example, a linear search.

The automatic test instrument 148 selects a sequence of configurations for routing data in a pattern, such as a snake chain pattern, through the programmable logic and interconnect circuits of PLD 102. Each configuration within the sequence is either generated as a function of the output data at pin 112 from one or more prior configurations in the sequence or is selected from a stored set of configurations previously generated. A configuration within the sequence may be generated as a function of output data at pin 112 from the preceding configuration in the sequence. The automatic test instrument 148 configures the power supply 162 and the PLD 102 with the configuration. The automatic test instrument 148 routes input data, such as value 150 and series 152, in the pattern through the programmable logic and interconnect circuits of PLD 102. The automatic test instrument 148 assesses the output data at pin 112 of PLD 102 to isolate a defect in PLD 102. Each configuration in the sequence further isolates the defect.

It is noted here that a configuration, once generated, can be stored for subsequent implementation and testing. A sequence can be selected for storage based on its use in multiple testing sequences or on other criteria.

In one embodiment, a configuration may be generated, in advance of testing, to test a targeted group of faults. Additional configurations may be generated to test a first subset of faults of the targeted group, and a second subset of the group. To further isolate a defect, further configurations can be generated using the first subset as the targeted group, generating configurations to test a first sub-subset and a second sub-subset of the targeted subset. This process can be continued, generating configurations targeting subsets of subsets until a configuration isolates each fault. The group of faults may be divided into more than two subsets (e.g. three or more). In one embodiment, the subsets may overlap. In one embodiment, a set of configurations is pre-generated and stored that is based on a particular algorithm for isolating the location of a defect, e.g., a binary search. In another embodiment that can be applied to an arrayed integrated circuit such as a programmable logic device, a first configuration can be used to isolate the row in which the defect is located, and a second configuration can be used to isolate the column. A set of third configurations can then be used to isolate the defect within the row/column location.

When automatic testing detects a failure using the configuration for the group of faults, the next configurations are those that test the subsets containing the detected fault. In this manner, pre-computed configurations can be used to isolate a defect.

Figure 3:
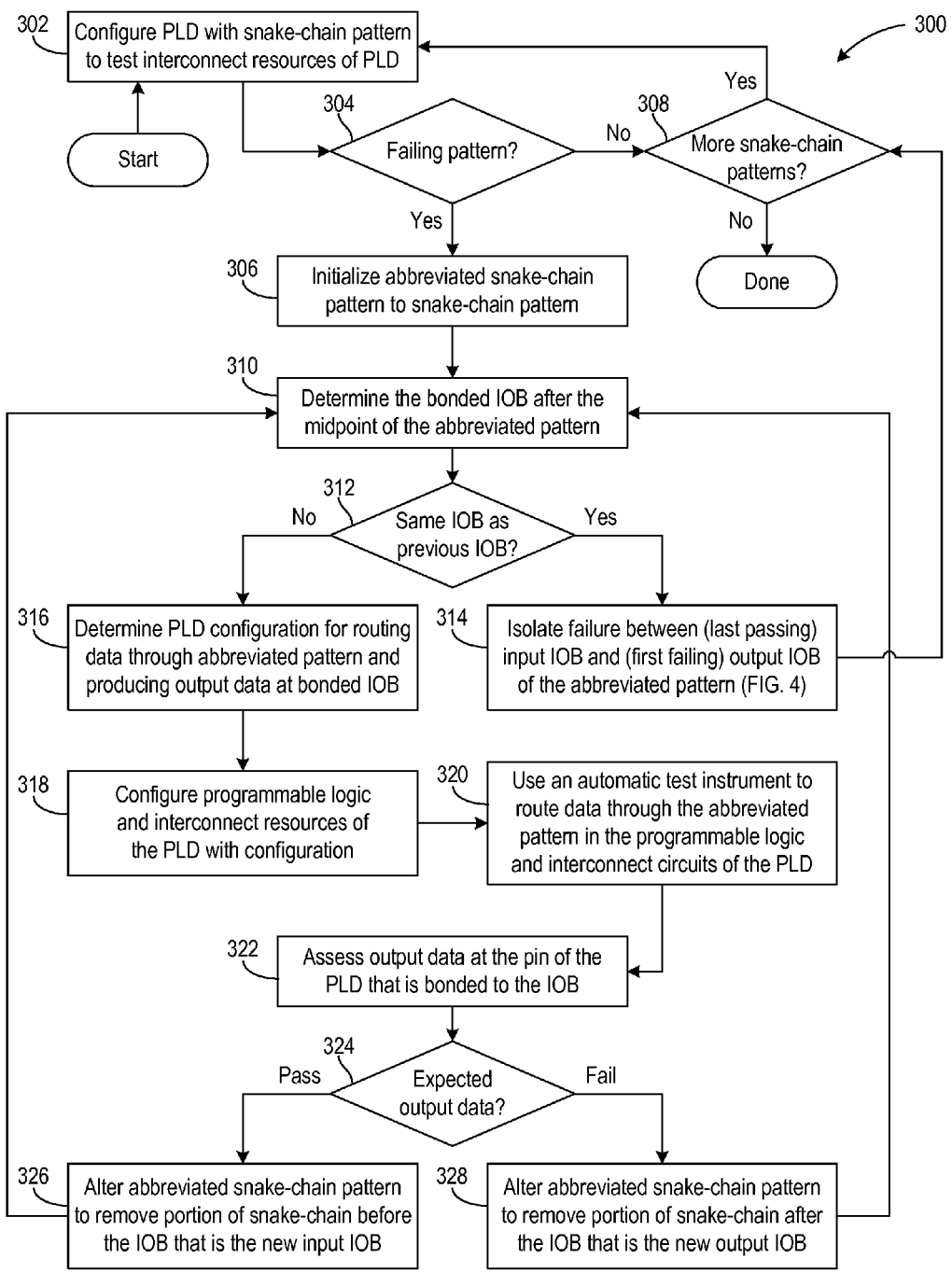
FIG. 3 is a flow diagram of a process for isolating a defect in a programmable logic device in accordance with various embodiments of the invention.

FIG. 3 is a flow diagram of a process 300 for isolating a defect in a programmable logic device in accordance with various embodiments of the invention. The defect causing a failure is first isolated to a portion of the snake chain pattern between two input/output blocks (IOBs) on the snake chain pattern.

At step 302, the PLD is configured with a snake-chain pattern for testing the programmable interconnect resources of a PLD. Manufacturing tests use snake-chain patterns to detect defective PLDs. Certain embodiments of the invention further test the defective PLDs to determine the cause of the manufacturing defect, and to determine whether the manufacturing process needs adjustment.

Decision 304 checks for failure of the snake-chain pattern. For a failing pattern, process 300 proceeds to step 306; otherwise, process 300 proceeds to decision 308. Decision 308 checks whether there are more snake-chain patterns to test. If so, process 300 returns to step 302 to test the next snake-chain pattern.

Various embodiments of the invention derive additional tests from the failing snake-chain pattern by truncating the failing snake-chain pattern. At step 306, process 300 initializes the abbreviated snake-chain pattern to the failing snake-chain pattern.

At step 310, an IOB near the middle of the abbreviated snake-chain pattern is determined. Frequently, the snake-chain pattern passes through all or nearly all of the IOBs in the PLD to test the PLD efficiently by using as many of the programmable interconnect resources as possible. Beginning from the flip-flop at the middle of the abbreviated snake-chain pattern, a search finds the first IOB along the snake-chain pattern. However, this IOB might not be bonded to a corresponding input/output pin of the PLD. For an IOB that is not bonded to an input/output pin, the search continues along the snake-chain pattern until the search finds a bonded IOB.

Decision 312 checks whether the IOB from step 310 is the same IOB of a previous iteration of step 310. If the middle IOB is the same IOB for two successive iterations, the initial isolation is complete and process 300 proceeds to step 314 for additional isolation of the defect. Otherwise, process 300 proceeds to step 316.

At step 316, configuration data is determined (e.g., generated or selected from a plurality of pre-existing configurations) for routing data through the initial portion of the abbreviated pattern to produce output data at the middle bonded IOB. At step 318, the configuration data configures the programmable logic and interconnect resources of the PLD to implement the initial portion of the abbreviated pattern. At step 320, an automatic test instrument routes data through the initial portion of the abbreviated pattern in the PLD. At step 322, the output data is assessed at the pin of the PLD for the middle bonded IOB. Decision 324 checks whether the output data is the expected data. If the output data is the expected data, then process 300 proceeds to step 326; otherwise, process 300 proceeds to step 328.

If the actual output data matches the expected output data, then the tested initial portion of the abbreviated pattern does not include the defect. Thus, the defect is in the untested latter portion of the abbreviated pattern. At step 326, the initial portion is removed from the abbreviated pattern to generate a new abbreviated pattern for the next iteration. The middle bounded IOB becomes the input IOB of the new abbreviated pattern and the output IOB is unchanged.

If the actual output data does not match the expected output data, then the tested initial portion of the abbreviated pattern includes the defect. At step 328, the latter portion is removed from the abbreviated pattern to generate a new abbreviated pattern for the next iteration. The middle bounded IOB becomes the output IOB of the new abbreviated pattern and the input IOB is unchanged.

At step 314, the failure is isolated between the input IOB and the output IOB of the current abbreviated pattern. The input IOB is the last IOB along the snake-chain pattern producing expected data and the output IOB is the first IOB along the snake-chain pattern producing corrupted data.

Figure 4:
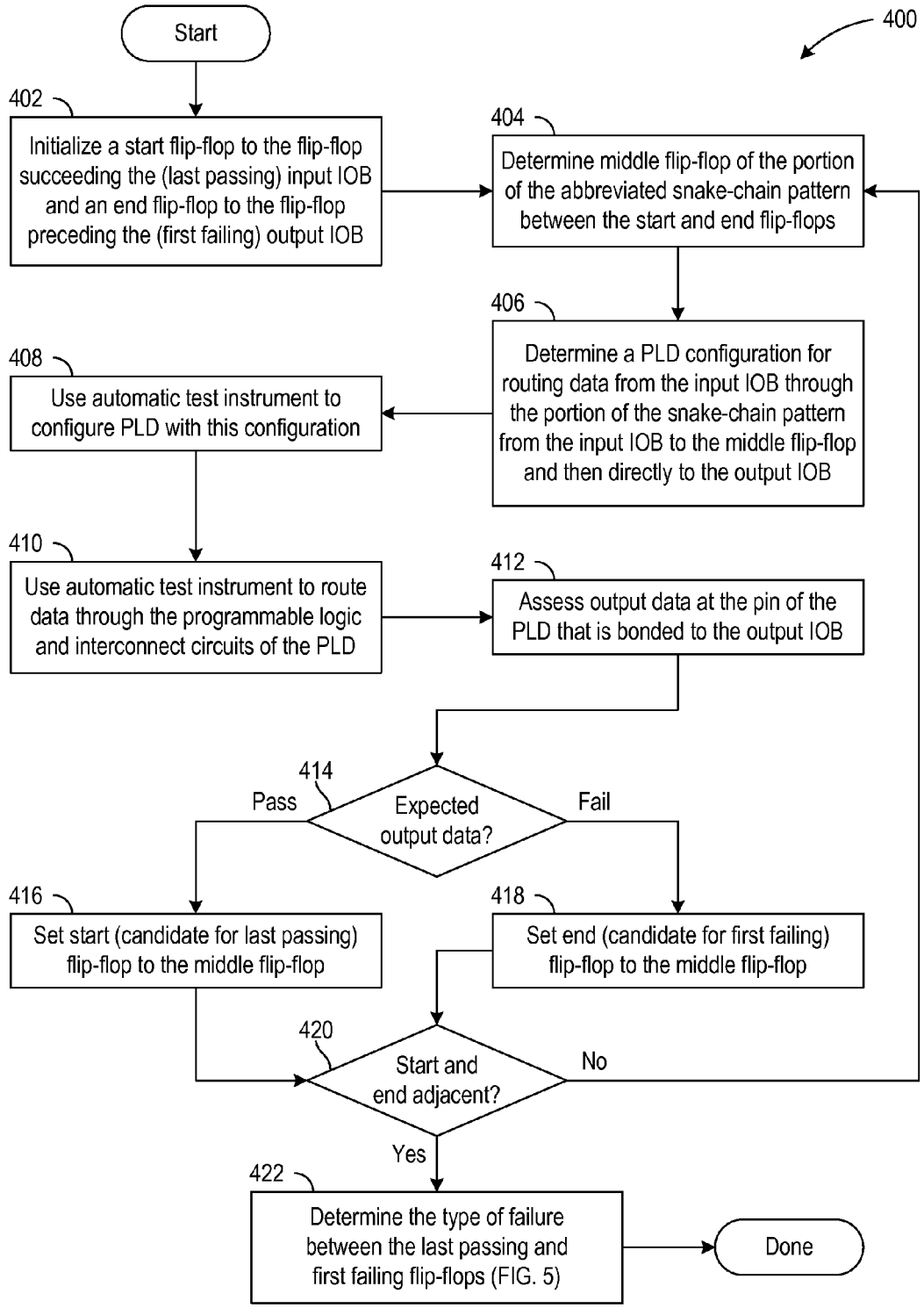
FIG. 4 is a flow diagram of a process for further isolating a defect in a programmable logic device in accordance with various embodiments of the invention.

FIG. 4 is a flow diagram of a process 400 for further isolating a defect in a programmable logic device in accordance with various embodiments of the invention. The defect is isolated between two flip-flops along the snake-chain pattern. In one embodiment, FIG. 4 corresponds with step 314 of FIG. 3. In another embodiment, defect isolation begins with process 400 of FIG. 4, with the input and output IOBs being the input and output IOBs of a failing snake-chain pattern.

Abbreviated patterns are created that include a portion of the snake-chain pattern between starting and ending flip-flops on the snake-chain pattern. At step 402, the start flip-flop is initialized to the first flip-flop following the input IOB along the snake-chain pattern, and the end flip-flop is initialized to the last flip-flop preceding the output IOB on the snake-chain pattern. At step 404, a middle flip-flop is determined within the portion of the snake-chain pattern between the start and end flip-flops. At step 406, configuration data is determined (e.g., generated or selected from a pre-generated plurality of configurations) for routing data from the input IOB to the start flip-flop, through the portion of the snake-chain pattern between the start and middle flips-flops, and then directly from the middle flip-flop to the output IOB. For example, when the configuration is generated during this step, a textual language specification of the previous configuration can be modified to re-route the data as needed, and then re-compiled to create the new configuration.

At step 408, automatic test equipment configures the PLD with the generated configuration data. At step 410, the automatic test equipment sends data to a pin corresponding to the input IOB and receives data from a pin corresponding to the output IOB. At step 412, the automatic test equipment assesses the data from the pin for the output IOB.

Decision 414 checks whether the actual output data is the expected output data. If the actual output data is the expected output data then the defect is in the untested portion after the middle flip-flop, and process 400 proceeds to step 416. Otherwise, the defect is in the tested portion before the middle flip-flop, and process 400 proceeds to step 418. At step 416, the middle flip-flop becomes the new start flip-flop for the next iteration. Similarly at step 418, the middle flip-flop becomes the new end flip-flop for the next iteration.

Decision 420 checks whether the start and end flip-flops are adjacent flip-flops along the snake-chain pattern. If the start and end flip-flops are not adjacent, process 400 returns to step 404 for further isolation of the defect. If the start and end flip-flops are adjacent, the defect is isolated to a portion of the snake-chain pattern between two adjacent flip-flops along the snake chain pattern, and process 400 proceeds to step 422. The start flip-flop is the last flip-flop along the snake-chain pattern storing expected data and the end flip-flop is the first flip-flop along the snake-chain pattern storing corrupted data. Step 422 determines the type of the defect.

Figure 5:
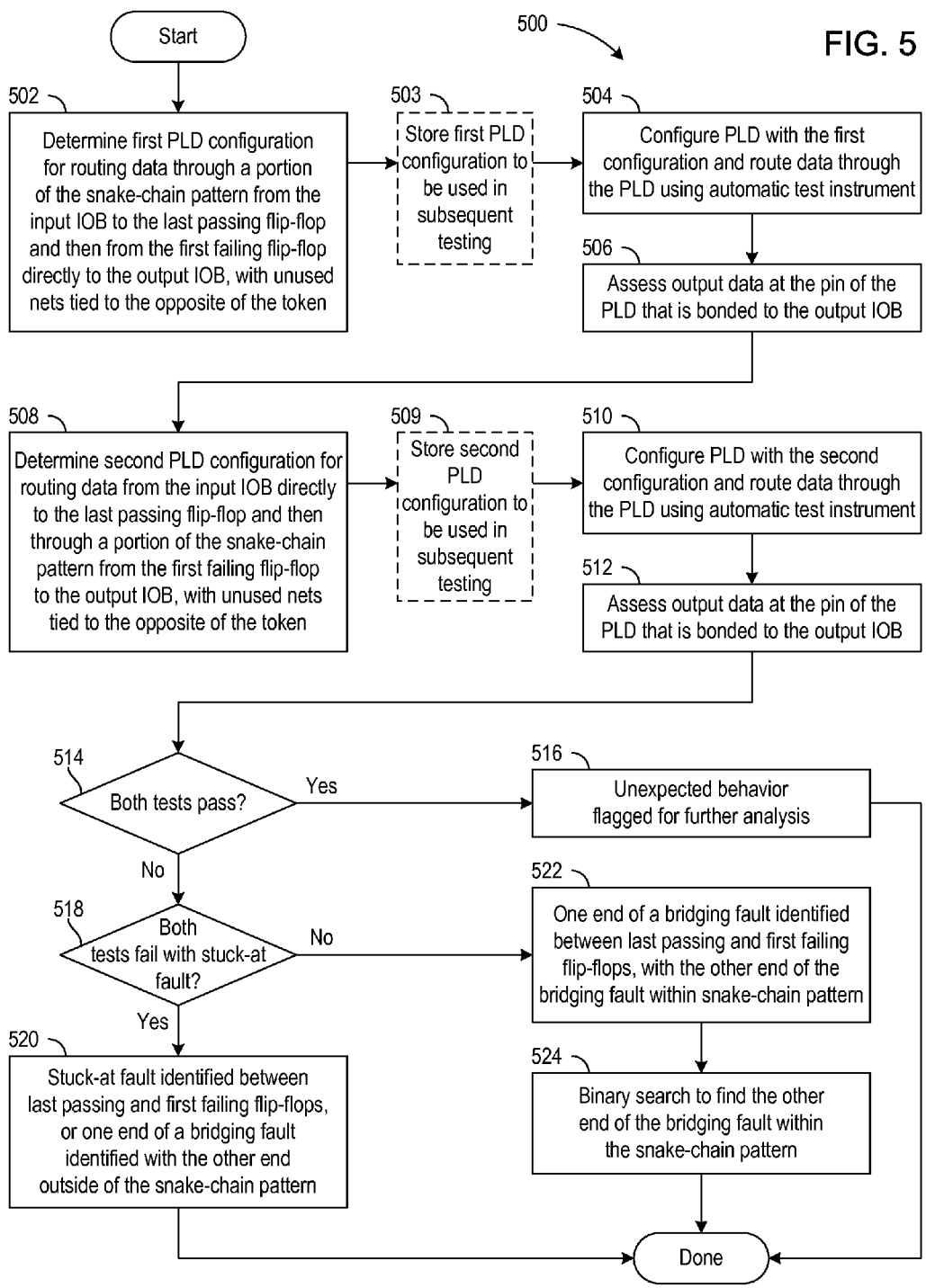
FIG. 5 is a flow diagram of a process for identifying a type of a defect in a programmable logic device in accordance with various embodiments of the invention.

FIG. 5 is a flow diagram of a process 500 for identifying a type of a defect in a programmable logic device in accordance with various embodiments of the invention. The type of the defect can be a stuck-at fault or a bridging fault. In one embodiment, process 500 corresponds to step 422 of FIG. 4.

At step 502, a first abbreviated pattern or PLD configuration is determined (e.g., generated or selected from a plurality of pre-generated configurations) that routes data from the input IOB through the portion of the snake-chain pattern from the input IOB through the last passing flip-flop to the first failing flip-flop, and then directly from the first failing flip-flop to the output IOB. The unused programmable interconnect resources are tied to a value opposite the value of the token of the routed data for the snake-chain pattern. Thus, the token will tend to be destroyed by any bridging fault to an unused programmable interconnect resource. At optional step 503, when step 502 includes generating the first PLD configuration, the first PLD configuration may be stored for use in subsequent testing, in embodiments in which at least one of the configurations is selected from among a plurality of configurations. At step 504, an automatic test instrument configures the PLD with configuration data for the abbreviated pattern and routes data through the PLD. At step 506, the automatic test instrument assesses the output data from the output IOB for the first test.

At step 508, a second abbreviated pattern or PLD configuration is determined that routes data from the input IOB directly to the last passing flip-flop, and then through the portion of the snake-chain pattern from the last passing flip-flop through the first failing flip-flop to the output IOB. The unused programmable interconnect resources are tied to a value opposite the value of the token of the routed data for the snake-chain pattern. At optional step 509, when step 508 includes generating the second PLD configuration, the second PLD configuration may be stored for use in subsequent testing, in embodiments in which at least one of the configurations is selected from among a plurality of configurations. At step 510, an automatic test instrument configures the PLD with configuration data for the abbreviated pattern and routes data through the PLD. At step 512, the automatic test instrument assesses the output data from the output IOB for the second test.

Decision 514 checks whether both tests pass. If both tests pass, process 500 proceeds to step 516; otherwise, process 500 proceeds to decision 518. Because both tests are designed to include the defect, further analysis is required at step 516 when both tests pass.

Decision 518 checks whether both tests fail with the signature of a stuck-at fault. If both tests have a stuck-at fault signature, process 500 proceeds to step 520; otherwise, process 500 proceeds to step 522.

At step 520, a stuck-at fault is identified between the last passing and first failing flip-flops, or one end of a bridging fault is identified between the last passing and first failing flip-flops. For a bridging fault, the other end of the bridging fault is outside of the snake-chain pattern. It will be appreciated that a different snake-chain pattern could have both ends of the bridging fault within the snake-chain pattern.

At step 522, a bridging fault is identified with one end of the bridging fault between the last passing and first failing flip-flops. The other end of the bridging fault is within the snake-chain pattern. At step 524, a binary search truncates the snake chain pattern for the failing test to isolate the other end of the bridging fault.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for testing integrated circuit devices having programmable logic. Further, it will be clear to those of skill in the art that the steps of the methods shown and described herein need not always be performed in the order shown and/or the order given in the following claims, or may be performed concurrently. For example, a plurality of configurations may all be generated and stored prior to creating the sequence of configurations, or the configurations may be generated and stored one by one, as determined by the results of testing the previous configuration in the sequence. As another example, the programmable logic may be configured, and the output data may be assessed, for each configuration during the creation of the sequence of configurations. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. For use with an automatic test instrument, a method for automatically isolating a defect in an integrated circuit having an array of programmable logic and interconnect circuits, the method comprising:
   creating a sequence of configurations for routing data in a pattern through the programmable logic and interconnect circuits, wherein each configuration within the sequence is determined as a function of output data from a prior configuration in the sequence;
   for each configuration in the sequence, configuring the programmable logic and interconnect circuits with the configuration and using the automatic test instrument for routing data in the pattern through the programmable logic and interconnect circuits configured with the configuration; and
   for each configuration in the sequence, assessing the output data from the routing of data in the pattern through the programmable logic and interconnect circuits configured with the configuration, and in response to the assessing of the output data for the configuration, isolating the defect to a portion of the pattern for the configuration that is within the portion for the prior configuration in the sequence.

2. The method of claim 1, wherein the creating the sequence of configurations comprises generating at least one configuration in the sequence as a function of the output data from the prior configuration in the sequence.

3. The method of claim 2, wherein the creating the sequence of configurations further comprises storing the at least one configuration in the sequence to be used in subsequent testing.

4. The method of claim 1, further comprising pre-generating a plurality of configurations, and wherein the creating the sequence of configurations comprises selecting at least one configuration in the sequence from among the plurality of configurations as a function of the output data from the prior configuration in the sequence.

5. The method of claim 1, wherein the creating the sequence of configurations includes determining the sequence of configurations for routing data in a snake-chain pattern through the programmable logic and interconnect circuits.

6. The method of claim 5, wherein the creating the sequence of configurations includes determining a first and succeeding second configuration in the sequence with the second configuration selectively altering the first configuration of one of a plurality of input/output blocks associated with the programmable logic and interconnect circuits along the snake-chain pattern, including altering the first configuration of the input/output block for generating the output data for the second configuration at a pin of the integrated circuit associated with the input/output block.

7. The method of claim 6, wherein the creating the sequence of configurations includes determining a sub-sequence of the configurations that perform a binary search of the input/output blocks of the programmable logic and interconnect circuits along the snake-chain pattern, and the isolating of the defect includes isolating the defect to a portion of the snake-chain pattern inclusively between a pair of the input/output blocks that both have an associated pin of the integrated circuit and are successive input/output blocks along the snake-chain pattern.

8. The method of claim 7, wherein the creating the sequence of configurations includes determining a first and succeeding second configuration in the sequence with the second configuration selectively removing the programmable logic and interconnect circuits in the portion for the first configuration inclusively between the pair of successive input/output blocks along the snake-chain pattern.

9. The method of claim 8, wherein the creating the sequence of configurations includes determining a sub-sequence of the configurations that perform a binary search of a plurality of flip-flops of the programmable logic and interconnect circuits in the portion of the snake-chain pattern inclusively between the pair of successive input/output blocks along the snake-chain pattern, and the isolating of the defect includes isolating the defect to a portion of the snake-chain pattern inclusively between a pair of the flip-flops that are successive flip-flops along the snake-chain pattern.

10. The method of claim 1, wherein the creating the sequence of configurations includes determining the sequence of configurations for identifying the defect using a binary search.

11. The method of claim 1, wherein the creating the sequence of configurations includes determining a first configuration and a succeeding second configuration that selectively removes the programmable logic and interconnect circuits in the portion for the first configuration.

12. The method of claim 1, wherein the creating the sequence of configurations includes determining each configuration in the sequence from a respective textual language specification and for each first and successive second configuration in the sequence, determining the respective textual language specification of the second configuration by automatically processing the respective textual language specification of the first configuration.

13. The method of claim 1, further comprising identifying the defect in one of the programmable logic and interconnect circuits of the integrated circuit.

14. The method of claim 1, further comprising identifying the defect that is an end of a bridging short.

15. The method of claim 1, further comprising identifying the defect that is a bridging short between two of the interconnect circuits of the integrated circuit.

16. The method of claim 1, wherein the using of the automatic test instrument for the routing of data in the pattern through the programmable logic and interconnect circuits configured with each configuration includes the automatic test instrument supplying serial input data having a token bit of a first value within a plurality of bits of a second value to an input/output block of the PLD and the automatic test instrument receiving the output data that is serial output data from another input/output block of the integrated circuit.

17. The method of claim 1, wherein the assessing of the output data for the configuration includes classifying the output data as one of a passing signature having expected output data of a token bit of a first value within a plurality of bits of a second value, a stuck-at fault signature having a series of at least one bit of a first value followed by a series of bits of a second value, and a bridging fault signature that is not a passing signature and is not a stuck-at fault signature.

18. The method of claim 1, wherein the creating the sequence of configurations includes determining a plurality of the configurations for implementing in the programmable logic and interconnect circuits a plurality of ring oscillators for producing heat and noise that interferes with the routing of data in the pattern through the programmable logic and interconnect circuits.

19. The method of claim 1, wherein the creating the sequence of configurations includes determining a plurality of the configurations for varying power supply voltage of the integrated circuit to interfere with the routing of data in the pattern through the programmable logic and interconnect circuits.

20. A program storage medium, comprising:
a processor-readable device configured with instructions for isolating a defect in an integrated circuit having an array of programmable logic and interconnect circuits, wherein execution of the instructions by at least one processor causes the at least one processor to perform operations including:
creating a sequence of configurations for routing data in a pattern through the programmable logic and interconnect circuits, wherein each configuration within the sequence is determined as a function of output data from a prior configuration in the sequence;
for each configuration in the sequence, configuring the programmable logic and interconnect circuits with the configuration and routing data in the pattern through the programmable logic and interconnect circuits configured with the configuration; and
for each configuration in the sequence, assessing the output data from the routing of data in the pattern through the programmable logic and interconnect circuits configured with the configuration, and in response to the assessing of the output data for the configuration, isolating the defect to a portion of the pattern for the configuration that is within the portion for the prior configuration in the sequence.

\* \* \* \* \*